United States Patent [19]

Morozumi

[11] Patent Number: 5,051,807

[45] Date of Patent: Sep. 24, 1991

[54] INTEGRATED SEMICONDUCTOR STRUCTURE WITH INCORPORATED ALIGNMENT MARKINGS

[75] Inventor: Yukio Morozumi, Nagano, Japan

[73] Assignee: Seiko Epson Corporation, Tokyo, Japan

[21] Appl. No.: 642,121

[22] Filed: Jan. 14, 1991

Related U.S. Application Data

[63] Continuation of Ser. No. 564,705, Aug. 9, 1990, abandoned, which is a continuation of Ser. No. 178,136, Apr. 6, 1988, abandoned.

[30] Foreign Application Priority Data

Apr. 7, 1987 [JP] Japan .................................. 62-85151

[51] Int. Cl.$^5$ ...................... H01L 27/02; H01L 29/06
[52] U.S. Cl. ........................................ 357/40; 357/51; 357/55
[58] Field of Search ..................... 357/17, 30, 23.7, 40, 357/45, 55, 51

[56] References Cited

U.S. PATENT DOCUMENTS

| | | | |
|---|---|---|---|
| 3,883,437 | 5/1975 | Nummedal et al. | 357/30 |
| 4,618,262 | 10/1986 | Maydan et al. | 356/357 |
| 4,755,750 | 7/1988 | Leuschner | 356/401 |
| 4,823,012 | 4/1989 | Kosugi | 250/491.1 |

FOREIGN PATENT DOCUMENTS

| | | |
|---|---|---|
| 60-35514 | 2/1985 | Japan . |
| 60-119774 | 6/1985 | Japan . |
| 60-119724 | 11/1985 | Japan . |
| 61-263116 | 11/1986 | Japan . |

OTHER PUBLICATIONS

"Hybrid Alignment: 5:1 Stepper with 1:1 Scanner", Fumiaki Ushiyama, Semiconductor International, Apr. 1985, pp. 180-183.
"Hybrid lithography . . . " Jerris H. Peavey, et al, SPIE Proceeding, vol. 334, 1982, pp. 149-156.

Primary Examiner—J. Carroll
Attorney, Agent, or Firm—Spensley Horn Jubas & Lubitz

[57] ABSTRACT

A semiconductor integrated circuit structure formed on a substrate and composed of a plurality of groups of integrated circuit chips each in the form of an elongated strip having a short dimension and a long dimension which is markedly longer than the short dimension, with adjacent chips in each group being spaced from one another by linear regions including a plurality of first linear regions extending parallel to the long dimension of the chips and at least one second linear region extending parallel to the short dimension of the chips, wherein, in each group, the at least one second linear region has a width greater than at least one of the first linear regions.

7 Claims, 3 Drawing Sheets

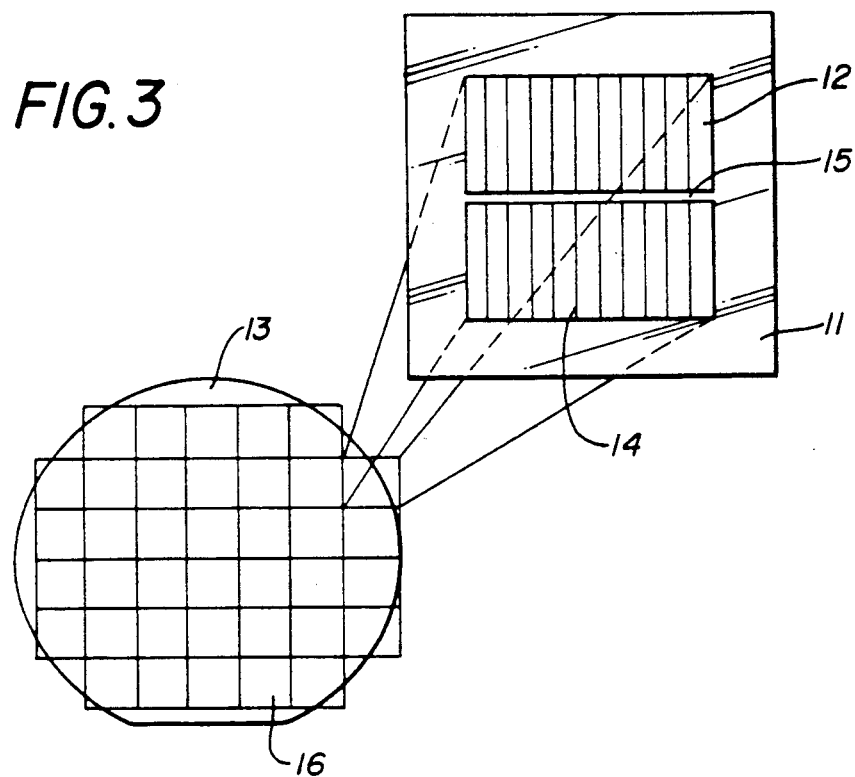
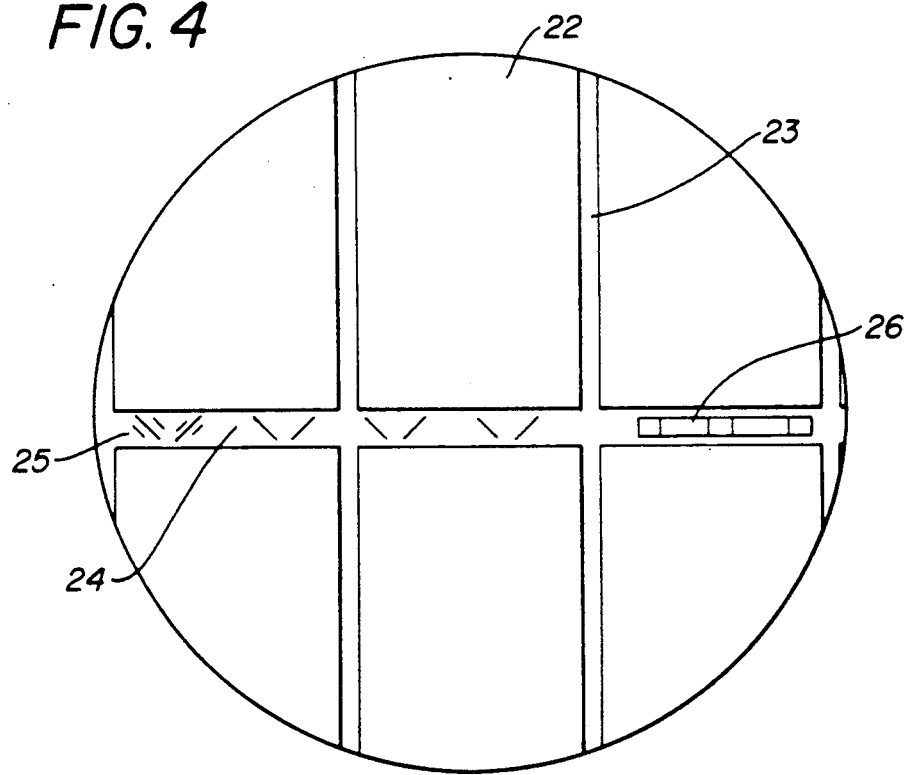

INTEGRATED SEMICONDUCTOR STRUCTURE WITH INCORPORATED ALIGNMENT MARKINGS

This is a continuation of application Ser. No. 07/564,704 filed on Aug. 9, 1990, now abandoned which is a continuation of application Ser. No. 07/178,136 filed Apr. 6, 1988, now abandoned.

BACKGROUND OF THE INVENTION

The present invention relates to a semiconductor integrated circuit structure, such as a wafer, having a plurality of chips in the form of strips which are to be separated, after manufacture, along scribe lines.

In the manufacture of integrated circuits, such as LSI circuits, is known to utilize a hybrid alignment method based on general photolithographic principles.

Hybrid alignment methods employ two types of exposure systems: stepping projection, or stepper: and scanning projection, or scanner. In a stepping projection system, each pattern is produced by reduction imaging, with a reduction ratio of 5:1 or 10:1, utilizing exposure equipment including a stepper. This system is employed when high resolution and accurate alignment are necessary. The scanning projection system involves a projection aligner in which the imaging ratio is 1:1. An optical system is disposed between the mask and the semiconductor wafer to project an image of the mask pattern onto the wafer. Mask deterioration is avoided because the mask does not contact the wafer. This system is employed when the particular operation does not require high resolution or accurate alignment. The advantages of the hybrid alignment method include a low total cost for the exposure system and a high production rate, the production rate being in terms of the number of wafers which can be processed during a given time period.

Hybrid alignment procedures are described, for example, in the following published articles: J. Peavey et al, SPIE Proceedings, Vol. 334, p 149 (1982); and F. Ushiyama et al, "Hybrid Alignment: 5:1 Stepper with 1:1 Scanner", SEMICONDUCTOR INTERNATIONAL, Apr., 1985.

The hybrid alignment method requires the provision of two types of alignment markings, each type being required for a respective one of the two systems. For the system involving image reduction, the area required on the substrate for each alignment marking is of the order of $30\mu$. Since this is less than the width of each scribe line, the provision of such alignment markings does not reduce the number of useable chips which can be formed on a given wafer.

On the other hand, the alignment markings for a projection aligner system require more space. One example of the automatic projection alignment markings for this system is illustrated in FIG. 1. These markings include markings 31 which are automatic alignment markings of the projection aligner type which are formed on the semiconductor wafer substrate by either the stepper or the projection aligner system in a preceding step. Markings 31 can be formed to have a convex outer surface in the manner described in F. Ushiyama et al, supra, or can be formed to have a concave configuration.

Markings 32 are present on the glass mask associated with the projection aligner system and can be formed as a positive or negative pattern using chromium. The nature of the pattern then produced on the wafer depends on whether the pattern on the mask is positive or negative or whether use is made of a positive or negative type resist.

Both sets of markings 31 and 32 extend to the right and left parallel to the flat surfaces of the substrate and the mask. The direction of the markings is associated with the crystal orientation of the wafer. The wafer surface is scanned with a laser beam 33 whose axis is substantially perpendicular to the wafer surface. The direction of scanning is indicated by the horizontal arrows. Automatic alignment is achieved when the laser light reflected from the wafer surface indicate that all of the intervals 34, 35, 36 and 37 are equal.

The area required for the alignment markings, 31, 32 has a width, in the vertical direction of FIG. 1, of the order of $160-200\mu$, and a length, parallel to the scanning direction, of the order of $600\mu$.

In addition, it is common practice in the art to form on a wafer a test element group which includes at least a process monitor transistor which subsequently serves to provide an indication of the quality of the fabrication operation. Generally, the test element group will include components which permit the monitoring of sheet resistance, contact resistance, the resistance associated with field reversal, pattern resolution and deviation, transistor properties, etc. Testing is carried out by contacting appropriate contact points of the test element group by means of pins mounted on a test card to obtain the desired measurements before the wafer is divided into individual chips. The test results permit a determination of whether subsequent tests of electrical properties and chip yield should be performed or not and provide information for subsequent process improvements.

When forming semiconductor layers with the stepper system, it has been found that associating the projection aligner type automatic alignment marks and the test element group pattern with each individual group of semiconductor components formed on the wafer is not desirable because it reduces the number of useable chips which can be formed on a wafer.

Many techniques have been proposed for inserting the automatic alignment markings. For example, Japanese Laid-open Patent No. 60-35514 discloses that automatic alignment markings can be applied by modifying the scribe lines between chips, while Japanese Laid-open Patent No. 60-119724 discloses that the automatic alignment markings can be placed in the spaces between the long sides of adjacent strip chips. However, the latter approach reduces the design freedom associated with the short sides of the strip chips. In fact, the smaller the dimension of the short side, the greater is the reduction in the number of useable chips which can be formed on a given wafer.

FIGS. 2(a)–2(c) illustrate successive steps in the manufacture of integrated circuits according to known procedures.

As shown in FIG. 2(a), a large number of strip chips are to be produced in a plurality of groups 46 on a wafer 45 of generally circular configuration. Each pattern for each group is provided on a glass reticle 48 which provides a pattern for one group which is to be imaged on wafer 45 according to the stepper, or size reduction, system. The pattern, which is imaged in steps on successive regions of wafer 45, includes a plurality of pattern areas 41, each associated with a respective strip chip, and a pattern area 42 containing at least one automatic alignment mark for a subsequent projection aligner step and a mask portion for forming at least the transistor of a process monitor. The resulting process monitor transistor will be used to perform an initial monitoring of the process and pattern area 42 can additionally include other components such as a resistor. The process monitor will serve to provide readings relating to the values of Vth (threshold voltage), contact resistance, diffused resistance, pressure resistance associated with field reversal, and the size of the transistor element. As can be seen, the length of the pattern area 42 is an integral multiple of the length of each strip chip to be produced.

Pattern area 42 is not reproduced on wafer 45 in association with each group of strip chips to be produced. Rather, before imaging of each group 46, pattern 42 on reticle 48 is covered by a shutter 43 in accordance with a predetermined imaging scheme, so that only the strip chip patterns 41 are imaged on wafer 45 in each region 46.

During this phase of one exposure operation, blank regions 44 are left near both the left and right sides of the wafer surface.

In a subsequent step, as shown in FIG. 2(b), shutter 43 is moved in order to additionally expose test element group pattern 42, and then the entire pattern on reticle 48 is imaged in an area portion 47 of each of the areas 44.

In a final stage, depicted in FIG. 2(c), shutter 43 is again displaced in order to cover both pattern 42 and a number of chip patterns 41, leaving exposed a part of the reticle pattern which corresponds to the size of the remaining portions 49 of each of the areas 44, and the portions of the pattern on reticle 48 which remain exposed are then imaged on portions 49 of wafer 45.

This sequence of steps is repeated for each pattern to be successively imaged on wafer 45.

The procedure described above represents a relatively complicated imaging operation requiring a large number of stepper movements to establish the necessary relative position between reticle 48 and wafer 45. Moreover, this procedure requires successive displacements of shutter 43 during the imaging of each pattern on wafer 45. Frequently, the movements of shutter 43 result in the deposition of particles on reticle 48, and these particles will result in the fabrication of defective circuits, thereby significantly reducing the yield of useable chips.

SUMMARY OF THE INVENTION

It is a primary object of the present invention to prevent the appearance of such particles on a pattern to be imaged.

Another object of the invention is to provide integrated semiconductor structures having a larger number of useable chips.

Yet another object of the invention is to provide integrated semiconductor structures which can be formed by simplified fabrication processes.

The above and other objects are achieved, according to the present invention, by a semiconductor integrated circuit structure formed on a substrate and composed of a plurality of groups of integrated circuit chips, each chip being in the form of an elongated strip having a short dimension and a long dimension which is markedly longer than the short dimension, with adjacent chips of each group being spaced from one another by linear regions including, in each group, a plurality of mutually parallel first linear regions extending parallel to the long dimension of the chips and at least one second linear region extending parallel to the short dimension of the chips, wherein, in each group, the at least one second linear region has a width greater than at least one of the first linear regions.

BRIEF DESCRIPTION OF THE DRAWING

FIG. 3 is a pictorial view illustrating an arrangement for forming one preferred embodiment of an integrated semiconductor structure according to the present invention.

FIG. 4 is a detail view, to an enlarged scale, of a portion of a semiconductor structure formed in the manner shown in FIG. 3.

DESCRIPTION OF THE PREFERRED EMBODIMENTS

Figure 1:
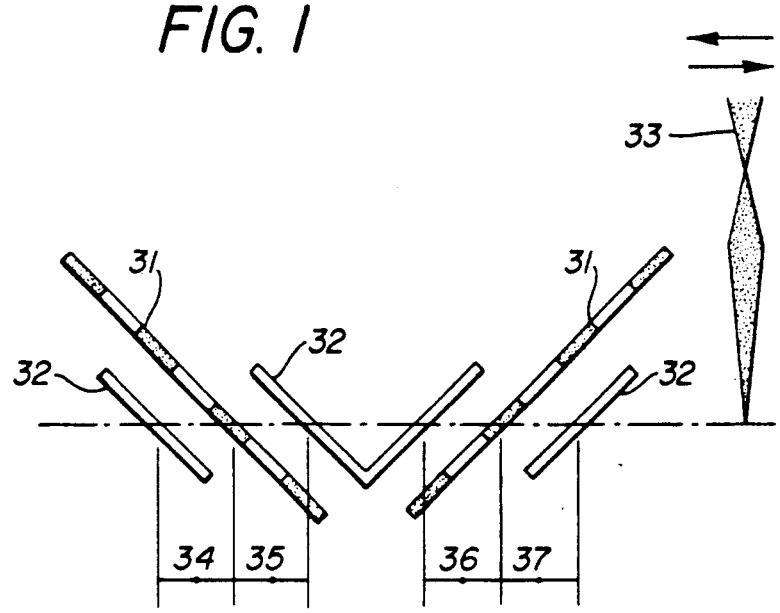
FIG. 1 is pictorial view illustrating a typical set of alignment markings employed in the manufacture of integrated circuits, FIG. 1 having been described above.

The manufacture of one embodiment of the invention is depicted in FIG. 3. Here, an assembly composed of a large number of severable integrated circuits in the form of strip chips is formed by successive photolithographic operations on a silicon wafer substrate 13. The strip chips are formed in successive groups 16. In the illustrated embodiment, each group 16 contains twenty-two IC strip chips.

The manner in which chips are arranged in each group 16 is illustrated on FIG. 3 by the IC strip chip layer mask patterns 12 which appear on a reticle 11, the pattern 12 for a group 16 being projected onto wafer 13.

At least one layer of each group 16 is formed by image reduction, the image on reticle 11 having dimensions which are, for example, five times as great as the corresponding dimensions of the projected image on substrate 13.

The resulting integrated circuit structure is composed of a large number of strip chips 22, parts of several of such chips being shown in the detail view of FIG. 4. According to one exemplary embodiment, each strip chip 22 may be a driver IC for a thermal print head, the driver IC containing CMOS devices with polycrystalline silicon gates. In the exemplary embodiment, each group 16 formed on wafer 13 is a square measuring 15 mm on a side and each strip chip 22 on wafer 13 measures 1.25×7.25 mm. Correspondingly, on reticle 11, the array of patterns 12 for a group 16 measures 75 mm on a side and each chip pattern 12 measures 6.25×36.25 mm.

FIG. 3 further depicts a wafer 13 having a diameter of 4 inches onto which thirty-eight groups 16 are formed, requiring 38 exposures for each photographic operation, with each group 16 containing twenty-two IC strip chips 22. Taking into account that certain groups are not formed entirely on wafer 13, 758 usable chips 22 will be formed.

The arrangement of chip groups according to the invention eliminates the need for a complicated exposure program and for shutter movements.

Figure 2A:
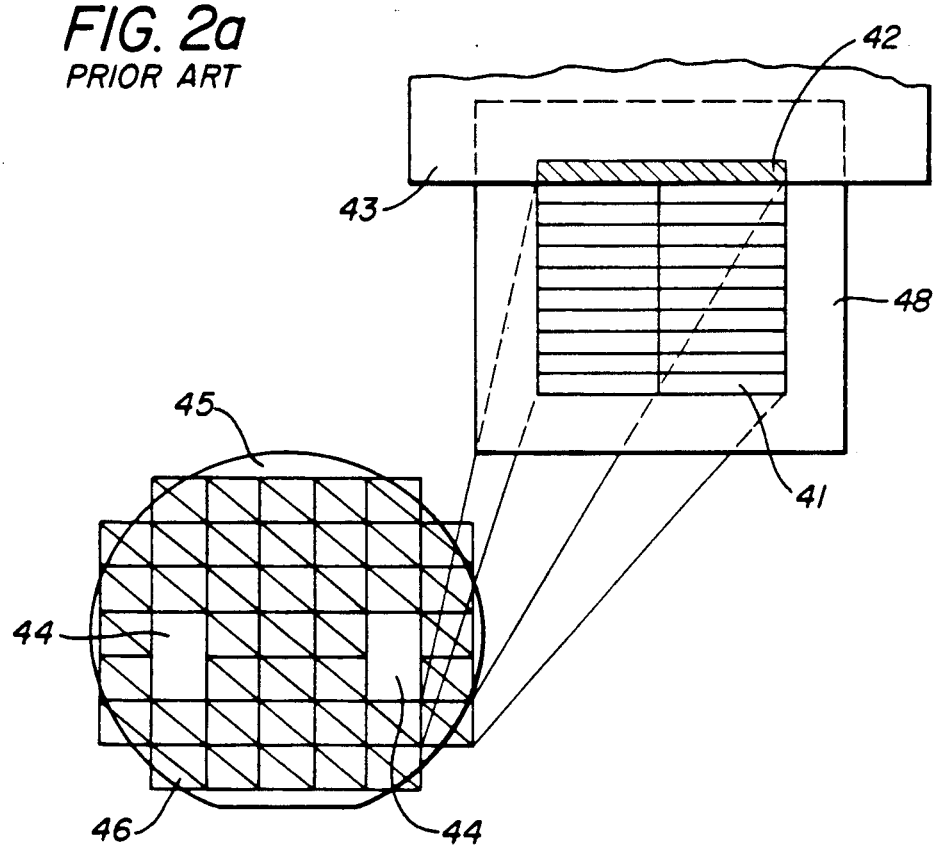
FIGS. 2(a)-2(c) are pictorial views illustrating successive stages in the manufacture of an integrated semiconductor structure according to the prior art, these figures having been described above.
Figure 2B:
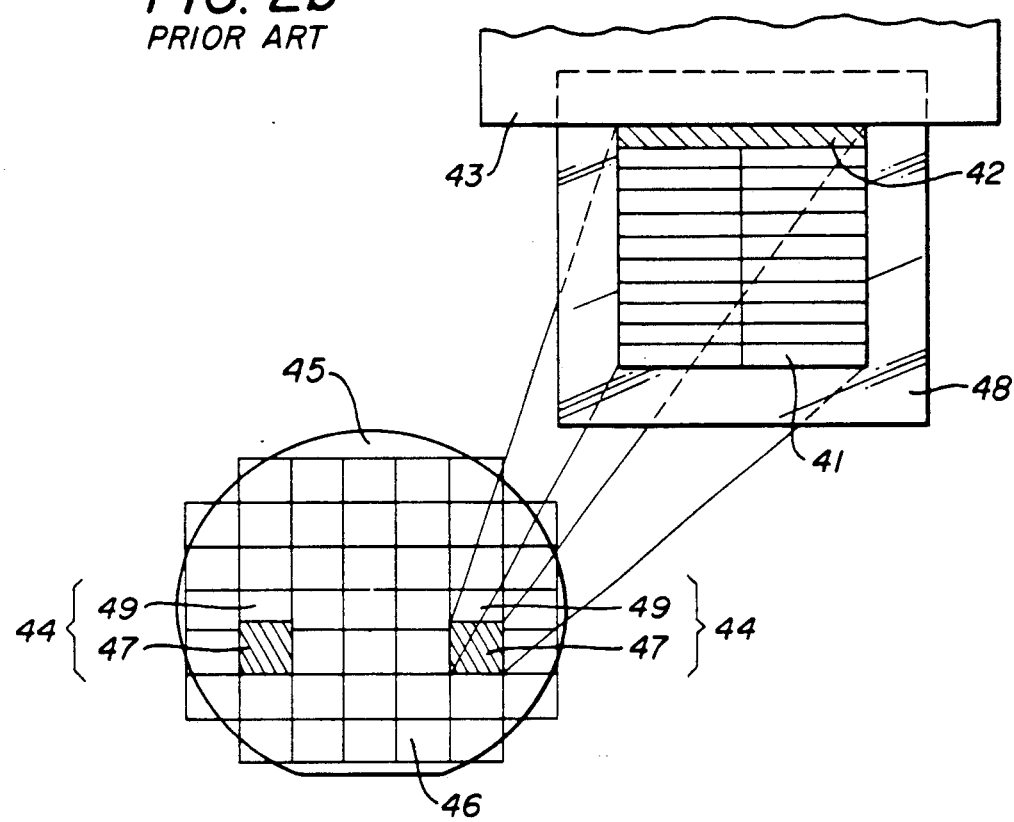
Figure 2C:
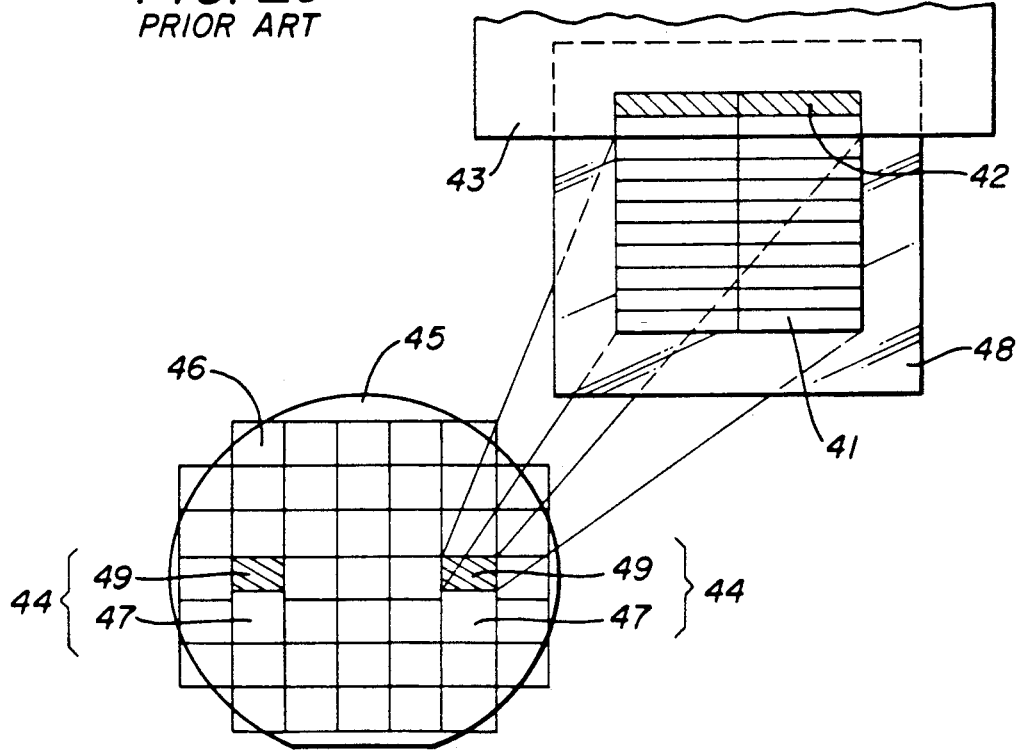

With the conventional shutter method shown in FIGS. 2, and even though all scribe lines can have a width of 60μ, the pattern on reticle 48 contains twenty strip chip regions 41, forty-five exposures are needed to cover wafer 45 completely, and a maximum of 754 complete, usable strip chips will be produced.

Thus, the present invention allows the number of exposures, and hence the number of alignment steps, to be reduced while offering the possibility of slightly increasing the number of usable chips. In addition, one cause of particles on the reticle, associated with shutter operation, is eliminated and the effective yield can be improved significantly.

A portion of one group 16 on wafer 13 is shown to an enlarged scale in FIG. 4, where parts of several strip chips 22 can be seen. To permit chips 22 to be separated from one another after manufacture, scribe lines 23 and 24 having selected widths are provided between adjacent chips 22. Lines 23 are located between the long sides of adjacent chips 22 and a line 24 is provided between the short sides thereof. In view of the arrangement of chip patterns 12 in each group 16, there is only one line 15 extending entirely across the group. In accordance with the usual practice in the art, the width of each line 23 between the long sides of adjacent chips 22 is of the order of 60μ, this being adequate for the subsequent separation, or dicing, operations.

However, according to the present invention, line 24 is given a width greater than that required for separating the chips. The width may be of the order of 160μ and is selected to allow formation, between chips 22, of automatic alignment marks 25 of the projection alignment type and a test element group 26 containing at least one process monitor transistor as well as resistors, etc.

Since, according to a feature of the present invention, a test element group is provided in each group 16, variations of properties across the wafer 13 can be calculated, and this makes possible the collection of data which can lead to improvements in quality.

If lines 23 were also given a width of 160μ, the number of usable chips which could be produced would be limited to 662.

The disclosed strip shape for chips 22 is desirable for a thermal printer head driver IC because the output pad of the driver should be positioned on one side of the IC chip so that the high power transistor and the logic circuit for forming one dot on a page being printed can be located opposite one another. Typically, the heat resistive substances for forming such dots are arranged at a spacing of 0.1 to 0.15 mm.

Accordingly, when the number of high power transistors and logic circuits, corresponding to the number of dots to be controlled by one chip, increases, the long dimension of the chip must increase.

Individual areas of wafer 13 are exposed in succession in a stepped manner to the pattern provided at reticle 11. In process steps where alignment accuracy is required, such as well, field, polycrystalline silicon, aluminum electrode and contact formation, a stepper system is employed.

Stoppers, source and drain, channel doping, and pad formation are performed by a mirror projection aligner based on the above-mentioned well, field, polycrystalline silicon, aluminum electrode and contact formation to form the IC chips on substrate 13.

While the present invention has been described with respect to a driver IC for a thermal print head, it will be appreciated that the present invention can be employed in the manufacture of strip chips for other types of integrated circuits, such as, for example, the driver IC for a fluorescent display, a liquid crystal display, a plasma display, a line sensor, a memory, etc.

Furthermore, structures according to the invention can be formed on wafer substrates other than silicon, including devices such as a sensor, using thin film transistors which are formed on insulating substrates of ceramic, glass, etc. Of course, the wafer 13 can be of any suitable size.

Moreover, semiconductor structures according to the invention may be of any type which is fabricated by photolithographic procedures employing the hybrid alignment method in which the length of the long side of each strip chip is greater than 5 mm and the length of the short side of each chip is less than 2.5 mm. In fact, a large ratio between the length and width of each chip serves to permit an increase in the number of useable strip chips which can be formed on a wafer of given size.

It will be appreciated that when reference has been made herein to scribe lines, these include the regions in each area 16 which have a width of 30–60μ and are required for the scribing operations used to separate the chips from one another, and the wider regions made available for application of the alignment markings 25 and the test element group pattern 26.

Thus, integrated semiconductor structures having the configuration contemplated by the present invention permit the various alignment processes to be simplified, the number of imaging steps to be reduced, and the number of useable chips formed on a wafer of given size to be increased. Moreover, the invention eliminates one significant source of defective chips, this being particles deposited on the imaging pattern reticle by shutter movements.

What is claimed:

1. A semiconductor integrated circuit structure formed on a substrate and composed of a plurality of groups of integrated circuit chips which are to be separated from one another after manufacture, each chip being in the form of an elongated strip having a short dimension and a long dimension which is markedly longer than the short dimension, the chips of each group being manufactured so that adjacent chips of each group are spaced from one another by linear scribe lines along which the substrate is to be cut to separate the chips, the scribe lines including a plurality of mutually parallel first linear scribe lines extending parallel to the long dimension of said chips, each said first linear scribe line having a width perpendicular to the long dimension of said chips, and at least one second linear scribe line extending parallel to the short dimension of said chips and being located between adjacent chips of the respective group, said second linear line having a width perpendicular to the short dimension of said chips, wherein the width of said at least one second linear scribe line is greater than the width of at least one of said first linear scribe lines, said structure further including at least one of an alignment mark and a process monitor transistor within said second linear scribe line.

2. A structure as defined in claim 1 wherein said at least one second linear scribe line has a width greater than the width of each of said first linear scribe lines.

3. A structure as defined in claim 2 wherein the width of said second linear scribe line is at least two times the width of each of said first linear scribe lines.

4. A structure as defined in claim 1 wherein the width of said second linear scribe line is at least two times the width of said at least one first linear scribe line.

5. A structure as defined in claim 1 further comprising an alignment mark and a process monitor transistor formed on said substrate within said second linear scribe line.

6. A structure as defined in claim 1 wherein each said first linear scribe line has a width no greater than about 60μ and said second linear scribe line has a width of at least about 160μ.

7. A structure as defined in claim 1 wherein each said chip has a length/width ratio of greater than two.

* * * * *